United States Patent [19]
Nguyen

[11] Patent Number: 5,917,369
[45] Date of Patent: Jun. 29, 1999

[54] PULSE WIDTH MODULATOR WITH AUTOMATIC GAIN CONTROL OVER-VOLTAGE MODULATOR AND LIMITER

[75] Inventor: Huey Nguyen, San Jose, Calif.

[73] Assignee: National Semiconductor Corporation, Santa Clara, Calif.

[21] Appl. No.: 09/030,626

[22] Filed: Feb. 25, 1998

[51] Int. Cl.⁶ .................................................. H03F 3/38
[52] U.S. Cl. ........................................ 330/10; 330/207 A
[58] Field of Search .................................. 330/10, 207 A, 330/251, 298, 207 P, 129, 279; 332/109, 110, 111; 375/238, 296, 316

[56] References Cited

U.S. PATENT DOCUMENTS

| | | | |
|---|---|---|---|
| 4,240,036 | 12/1980 | Kohler | 330/10 |
| 5,014,016 | 5/1991 | Anderson | 330/10 |
| 5,767,740 | 6/1998 | Fogg | 330/10 |
| 5,805,020 | 9/1998 | Danz et al. | 330/10 |

*Primary Examiner*—Robert Pascal
*Assistant Examiner*—Henry Choe
*Attorney, Agent, or Firm*—Skjerven, Morrill, MacPherson, Franklin & Friel LLP; Edward C. Kwok

[57] ABSTRACT

A pulse-width modulation (PWM) circuit in a Class D audio amplifier includes output-limiting logic and an automatic gain control (AGC) circuit. When an out-of-range, or overmodulated, input signal is received by the PWM, mono-stable multivibrator circuits provide discharge pulses that ensure that the PWM output will not spend excessive time in a single state. By using discrete mono-stable multivibrators, uniform and repeatable pulses can be generated at precise intervals. In addition, when an out-of-range input signal is detected, the AGC circuit lowers the gain on the input signal until it falls within the acceptable range of the PWM, enabling more faithful reproduction of the original signal.

13 Claims, 5 Drawing Sheets

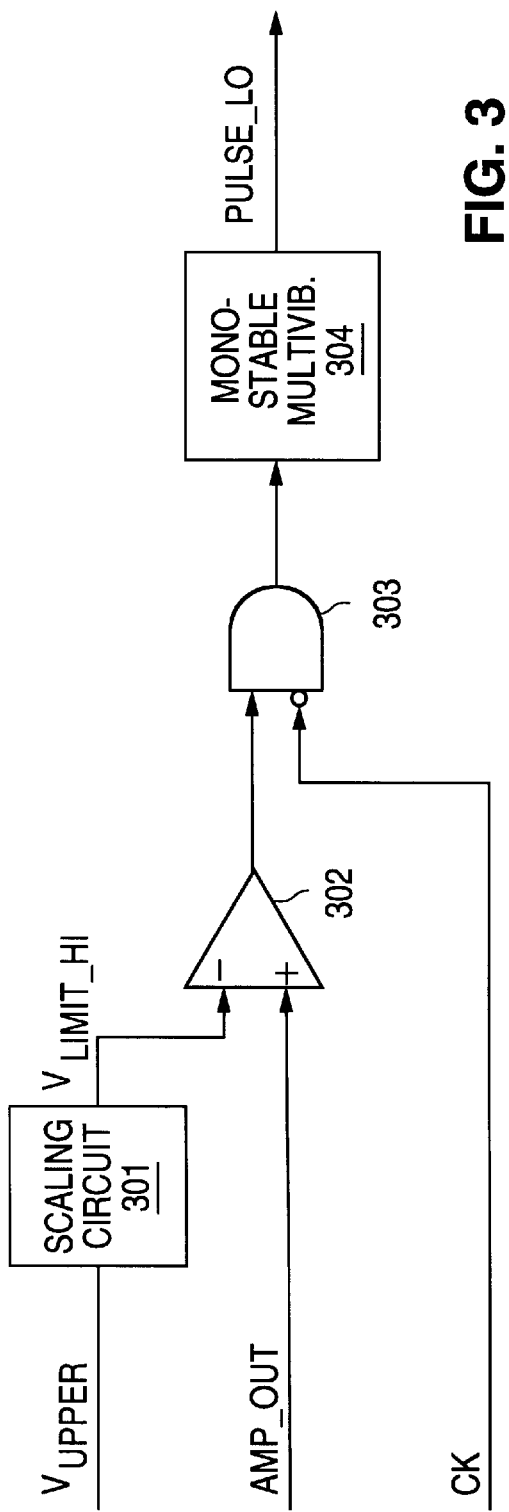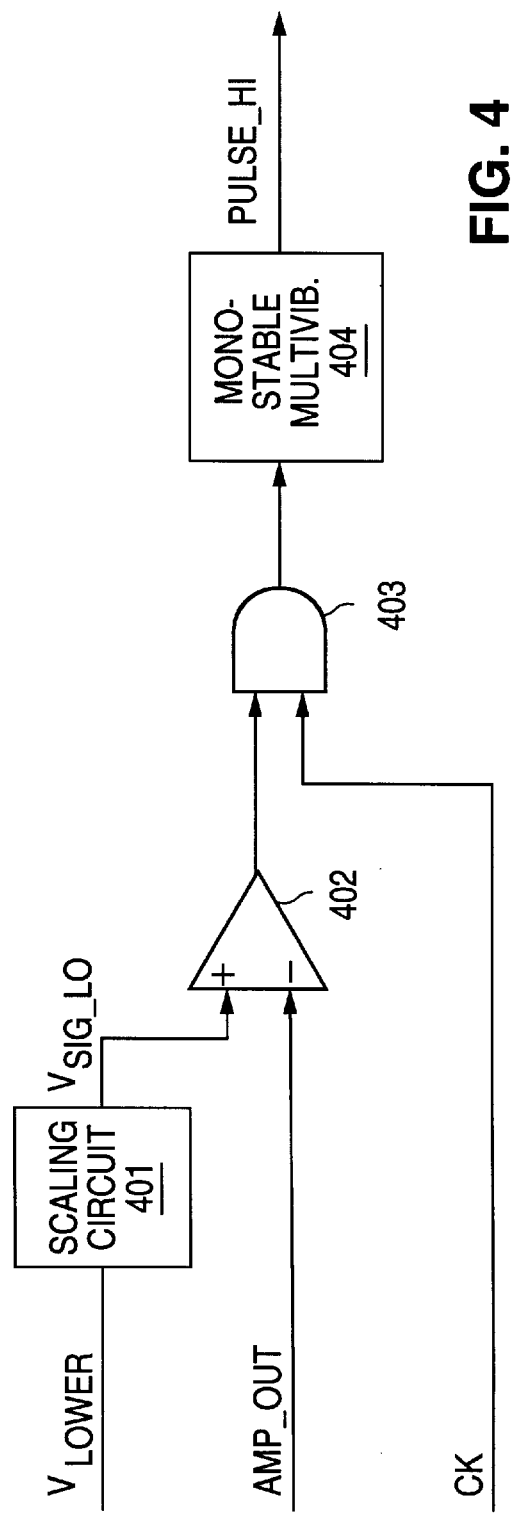

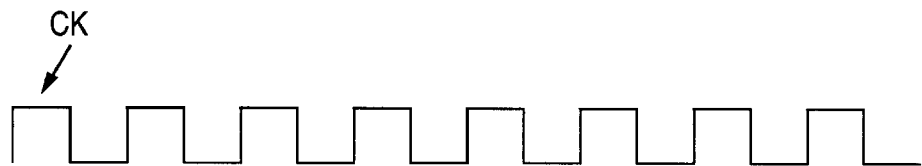
FIG. 5a
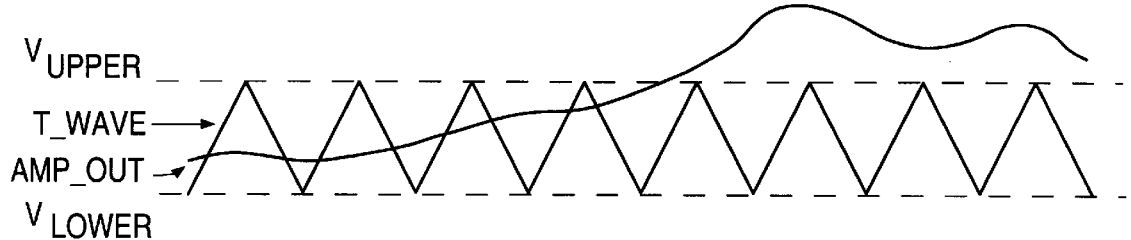
FIG. 5b
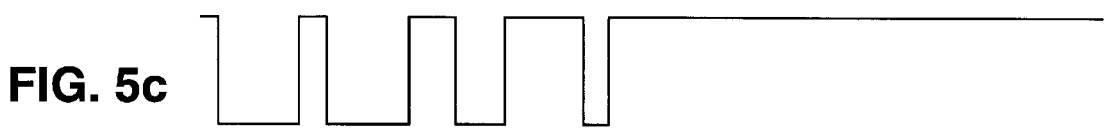
FIG. 5c
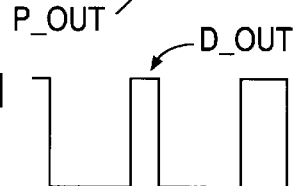
FIG. 5d
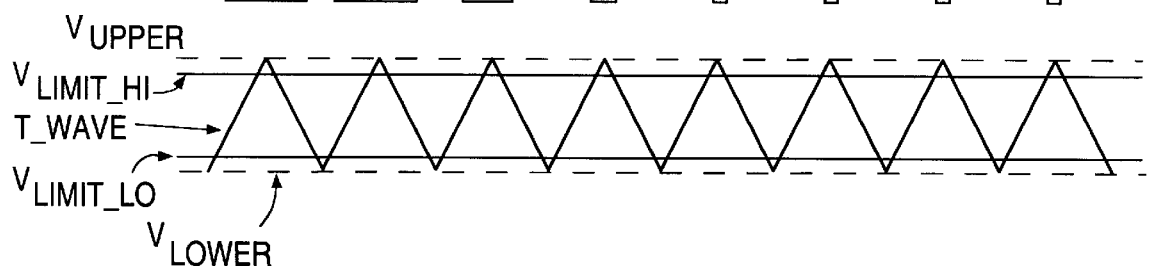
FIG. 5e
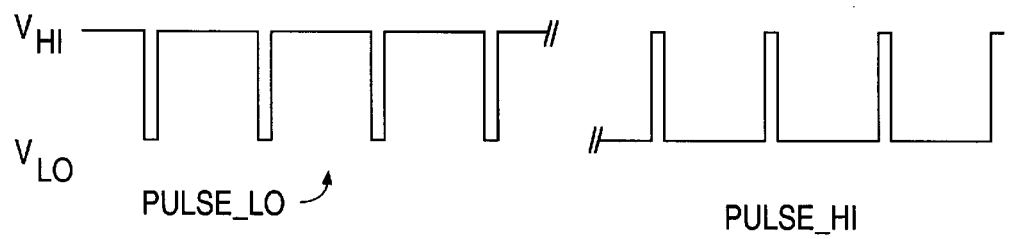
FIG. 5f  FIG. 5g

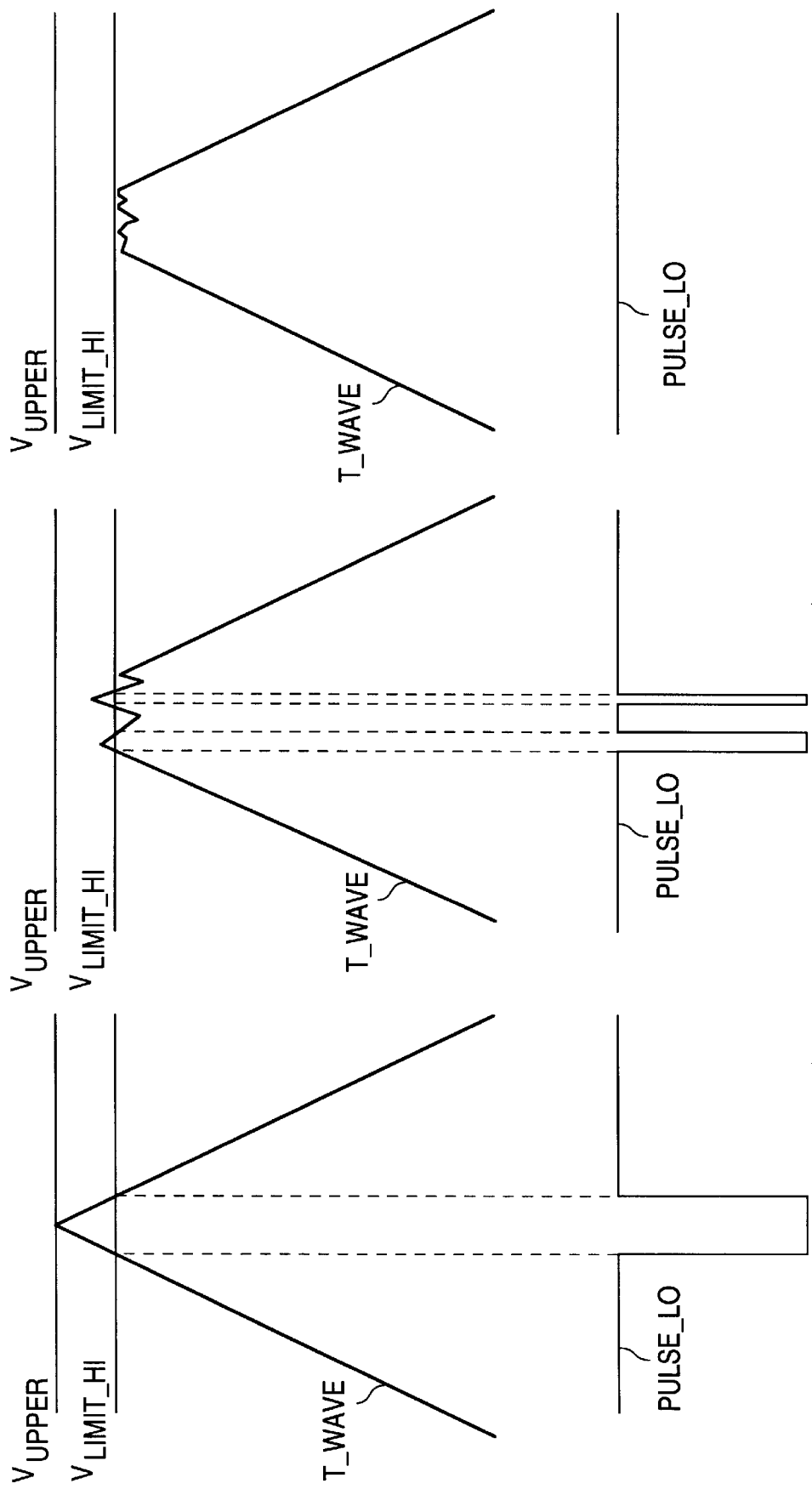

PULSE WIDTH MODULATOR WITH AUTOMATIC GAIN CONTROL OVER-VOLTAGE MODULATOR AND LIMITER

BACKGROUND OF THE INVENTION

1. Field of the Invention

The present invention relates to Class D electronic amplifiers, and in particular, to a pulse width modulator with over-voltage modulation and automatic gain control.

2. Discussion of the Related Art

In a class D audio amplifier, a pulse width modulator is used to convert an incoming analog signal into a digital signal for improved transmission integrity. This digital signal is later converted back to an analog signal by an LC filter in order to drive an output speaker. A block diagram of this sequence is shown in FIG. 1. An analog signal A_SIG is received by an amplifier 112, which applies a desired amount of gain to signal A_SIG to generate a signal AMP_OUT. Meanwhile, an oscillator circuit 102 provides a binary clocking signal CK to a triangle wave generator 103, which generates a triangle wave voltage signal T_WAVE that oscillates between high inflection points at an upper voltage potential Vupper and low inflection points at a lower voltage potential Vlower. FIG. 5a depicts signal CK, while FIG. 5b shows signal T_WAVE, over which signal AMP_OUT has been superimposed. A comparator circuit 106 compares signal T_WAVE and signal AMP_OUT, and generates an output at a voltage potential Vhigh when signal AMP_OUT is larger than signal T_WAVE, and generates an output at a voltage potential Vlow when the reverse is true. This produces a digital output pulse signal P_OUT, as shown in FIG. 5c. Although signal P_OUT has pulse widths proportional to the magnitude of analog signal AMP_OUT, it cannot be sent directly to an LC filter 113. As can be seen in FIG. 5c, signal P_OUT is made up of a series of pulses between voltage potentials Vlo and Vhi, with a low-going pulse roughly centered around each high inflection point of signal T_WAVE, and a high-going pulse roughly centered around each low inflection point of signal T_WAVE. However, if signal AMP_OUT goes outside the bounds defined by voltage potentials Vupper and Vlower, signal P_OUT becomes fixed in a single output state. For example, if signal AMP_OUT becomes greater than voltage potential Vupper, as shown in the right portion of FIG. 5b, signal P_OUT becomes pegged at voltage potential Vhi, as shown by the corresponding portion of FIG. 5c. Likewise, if signal AMP_OUT drops below voltage potential Vlower, signal P_OUT falls to a constant voltage Vlo. In either case, the unchanging signal P OUT would quickly saturate the inductor coil of LC filter 113, leading to overheating and possible permanent damage. Therefore a typical PWM includes a pulse generator circuit 115 that provides a rapid discharge pulse to ensure that the inductor coil of the LC filter is given a chance to discharge even if signal P_OUT does not change state. As shown in FIG. 1, a conventional embodiment of pulse generator 105 includes a signal generator 104 which produces an output voltage Vlimit_hi that is typically 90–95% of voltage Vupper, and a signal generator 105 produces an output voltage Vlimit_lo that is typically 5–10% greater than voltage Vlower. Voltages Vlimit_hi and Vlimit_lo are compared to signal T_WAVE by comparators 107 and 108, respectively, in order to generate short discharge pulses about every high or low inflection point of signal T_WAVE. As shown in FIG. 5e, comparator 107 produces a low-going pulse signal PULSE_LO, while comparator 108 produces a high-going pulse signal PULSE_HI.

A safety discharge circuit 116 made up of AND gates 109 and 110 and OR gate 111 combine the pulses of PULSE_HI and PULSE_LO with signal P_OUT, thereby ensuring that signal D_OUT does not continuously remain at a single voltage potential. FIG. 5d shows how the example signal P_OUT shown in FIG. 5c is modified by signal PULSE_LO to produce varying output signal D_OUT.

This method of output regulation to prevent invariant output signals has two major problems. The first derives from the use of triangle wave signal T_WAVE as the reference for pulse signals PULSE_HI and PULSE_LO. If signal T_WAVE is precise and consistent, pulse signals PULSE_HI and PULSE_LO will be properly generated as shown in FIG. 7a. However, the inflection points of a triangular wave will generally not be sharp transitions. As shown in FIG. 7b, fluctuations at the inflection point can cause multiple triggering, which can lead to output signal distortion or even LC filter failure due to reduced discharge time. Substantial noise can even lead to a no-triggering situation, as shown in FIG. 7c. In either case, the lack of precise triangular waveform can limit the effectiveness of pulse generator circuit 115.

The other problem is the fact that even if pulse generator circuit 115 is functioning properly, if signal AMP_OUT remains outside the band between voltages Vlower and Vupper, or "overmodulated", signal D_OUT will stay at maximum output. Not only does this situation prevent the transmission of any useful signal information, but it will eventually lead to system damage if permitted to continue unabated.

Accordingly, it is desirable to provide a PWM circuit that ensures proper discharge pulse creation and also deals with long-term overmodulated input signals.

SUMMARY OF THE INVENTION

The present invention provides a Class D amplifier PWM circuit that prevents output filter saturation. An embodiment of the present invention includes a triangle wave generator and a comparator circuit to generate a rectangular wave from an input analog signal, and a pulse generation circuit to generate discharge pulses when the input analog signal is out of range of the comparator circuit. The pulse generation circuit runs off of the same clocking signal used by the triangle wave generator, but has a separate mono-stable multivibrator. Reliable and consistent discharge pulse generation is achieved since the discharge pulse timing and magnitude are no longer dependent on the quality of the output of the triangle wave generator. An embodiment of the present invention further includes an input amplifier circuit to apply a desired gain to the input analog signal, and an automatic gain control circuit to lower the gain of the input amplifier circuit whenever an out-of-range signal is detected. This prevents potentially damaging constant high-output signals from appearing on the output of the amplifier, and also enables transmission of a representative output signal for overmodulated input signals.

This invention will be more fully understood after consideration of the following detailed description taken along with the accompanying drawings.

BRIEF DESCRIPTION OF THE DRAWINGS

FIG. 3 is a block diagram of a low pulse generator of the present invention;

FIG. 4 is a block diagram of a high pulse generator of the present invention;

FIG. 5a is a waveform of a clock signal CK;

FIG. 5b is an analog input signal AMP_OUT superimposed on a triangle wave T_WAVE;

FIG. 5c is a rectangular wave P_OUT generated by the comparison of signal AMP_OUT and triangle wave T_WAVE;

FIG. 5d is a rectangular wave D_OUT generated by subtracting discharge pulses from rectangular wave P_OUT;

FIG. 5e–5g shows the generation of discharge pulses PULSE_LO and PULSE_HI;

FIG. 7a shows the generation of a discharge pulse PULSE_LO in a conventional PWM circuit;

FIG. 7b shows the generation of multiple discharge pulses in a conventional PWM circuit;

FIG. 7c shows the non-generation of a discharge pulse in a conventional PWM circuit.

Use of the same reference numbers in different figures indicates similar or like elements.

DETAILED DESCRIPTION

Figure 1:
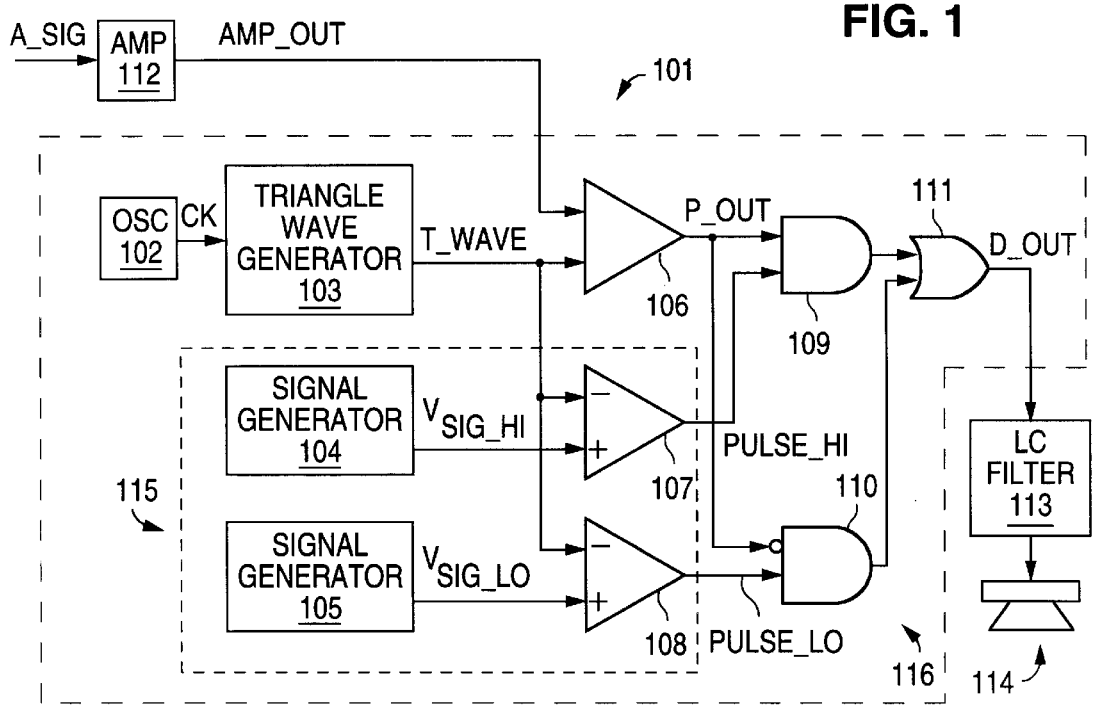
FIG. 1 is a block diagram of an embodiment of a conventional Class D audio amplifier pulse-width modulation circuit.
Figure 2:
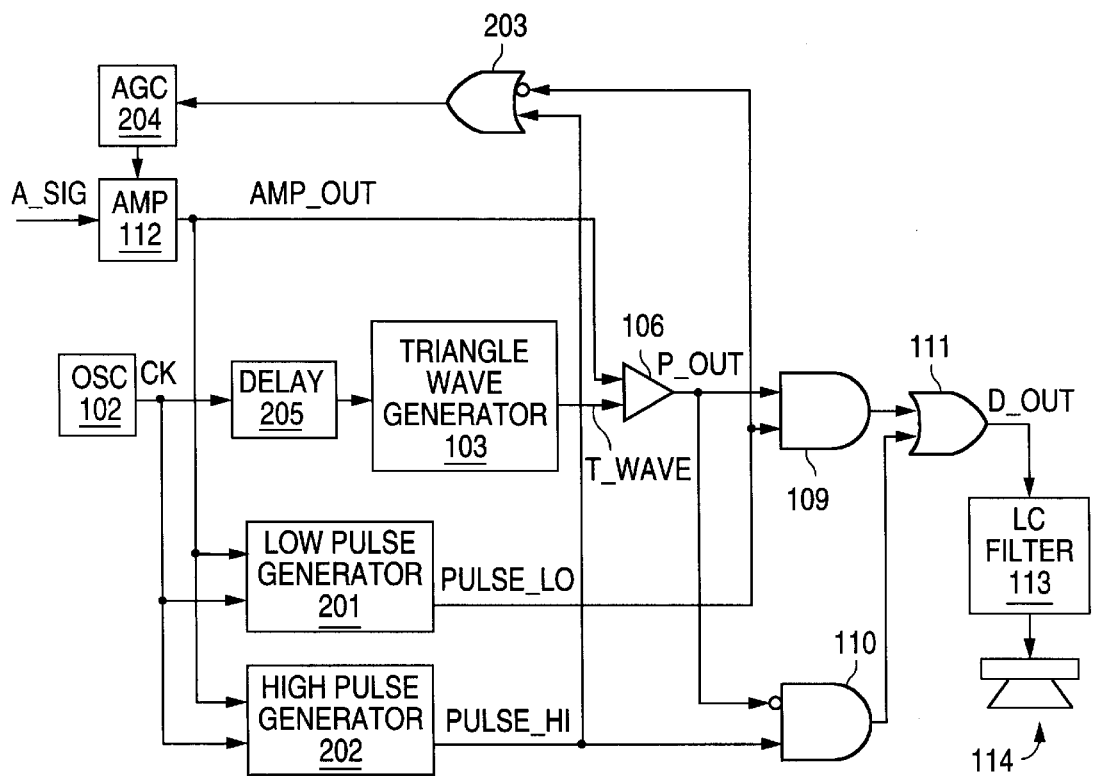
FIG. 2 is a block diagram of an embodiment of the present invention.
Figure 6A:
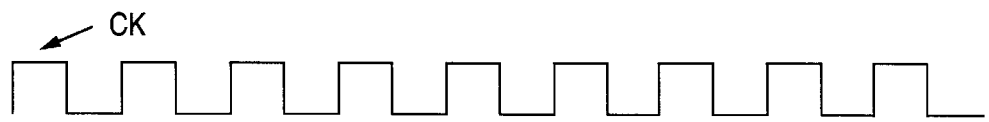
FIG. 6a is a waveform of a clock signal CK.
Figure 6B:
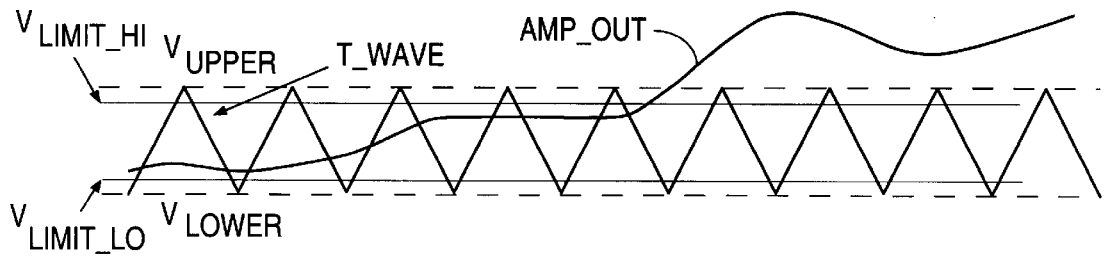
FIG. 6b is an analog input signal AMP_OUT superimposed on a triangle wave T_WAVE.
Figure 6C:
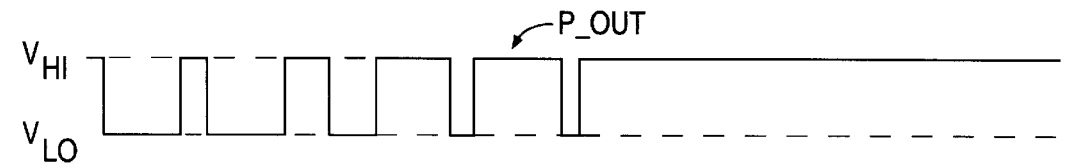
FIG. 6c is a rectangular wave P_OUT generated by the comparison of signal AMP_OUT and triangle wave T_WAVE.

An embodiment of the present invention is shown in FIG. 2. An input analog signal A_SIG is amplified and transformed into a digital signal through pulse-width modulation, and then transformed back into an analog signal by an LC filter 113 in order to drive an external speaker 114. An amplifier circuit 112 applies a desired gain to input analog signal A_SIG, generating an analog signal AMP_OUT. An oscillator 102 provides a clock signal CK, shown in FIG. 6a, that is used by a triangle wave generator 103 to generate a constant triangle wave signal T_WAVE that swings between upper inflection points at an upper voltage Vupper and lower inflection points at a lower voltage Vlower. A comparator 106 performs pulse-width modulation on signal AMP_OUT by comparing signal AMP_OUT to signal T_WAVE, as shown in FIG. 6b. Comparator 106 creates a digital signal P_OUT, a rectangular wave switching between a lower voltage potential Vlo and an upper voltage potential Vhi, as shown in FIG. 6c. Note that when signal AMP_OUT becomes greater than voltage Vupper, signal P_OUT remains at voltage Vhi. Similarly, should signal AMP_OUT have fallen below voltage Vlower, signal P_OUT would have dropped to a constant voltage Vlo.

Figure 6D:
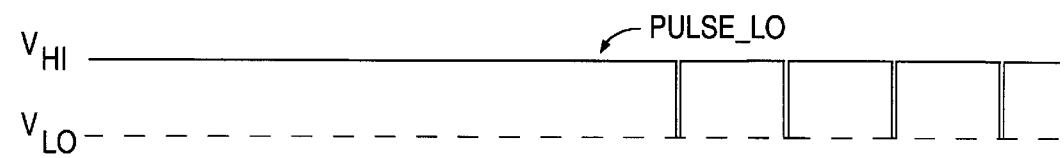
FIG. 6d is a discharge pulse waveform PULSE_LO generated by a low pulse generator.

Extended time by signal P_OUT in either limit situation would damage LC filter 113. In fact, because the inductor in LC filter 113 requires a finite amount of time to discharge sufficiently to prevent coil saturation, the allowable range of signal A_SIG is somewhat less than the amplitude of signal T_WAVE. As shown in FIG. 6b, signal AMP_OUT must fall into the band defined by voltages Vlimit_hi and Vlimit_lo. Any signal AMP_OUT outside of that band is out-of-range, or overmodulated, and would not be able to produce a pulse of duration sufficient to allow adequate inductor discharge in LC filter 113. The block diagram in FIG. 2 includes a low pulse generator 201 and a high pulse generator 202. When signal AMP_OUT is larger than voltage Vlimit_hi, low pulse generator 201 uses clocking signal CK to generate low-going pulses at the upper inflection points of signal T_WAVE. An implementation of low pulse generator 201 according to the present invention is depicted in FIG. 3. A scaling circuit 301 applies a scaling factor to voltage Vupper in order to generate voltage Vlimit_hi. A comparator 302 asserts a logic HIGH signal when signal AMP_OUT is larger than voltage Vlimit_hi. The logic HIGH output of comparator 302 is sent to an AND gate 303, which then switches its own output to a logic HIGH state when clock signal CK goes low, corresponding to a high inflection point of signal T_WAVE. An edge-triggered mono-stable multivibrator 304 provides a constant output signal PULSE_LO at voltage Vhi. When triggered by a rising output from AND gate 303, multivibrator 304 produces a pulse at voltage Vlower of duration adequate for proper inductor discharge in LC filter 113. In this manner, low pulse generator 201 detects when signal AMP_OUT is too large, and generates low pulses accordingly, as shown in FIG. 6d. Similarly, when signal AMP_OUT is less than voltage Vlimit_lo, high pulse generator 202 uses clocking signal CK to generate a high-going pulse at the lower inflection points of signal T_WAVE. An implementation of high pulse generator 202 according to the present invention is depicted in FIG. 4. A scaling circuit 401 applies a scaling factor to voltage Vlower in order to generate voltage Vlimit_lo. A comparator 402 asserts a logic HIGH signal when signal AMP_OUT is less than voltage Vlimit_lo. The logic HIGH output of comparator 402 is sent to an AND gate 403, which then switches its own output to a logic HIGH state when clock signal CK goes HIGH, corresponding to a low inflection point of signal T_WAVE. An edge-triggered mono-stable multivibrator 404 provides a constant output signal PULSE_HI at voltage Vlo. When triggered by a rising output from AND gate 403, multivibrator 404 produces a pulse at voltage Vupper of duration adequate for proper inductor discharge in LC filter 113. In this manner, high pulse generator 202 detects when signal AMP_OUT is too small, and generates high pulses accordingly. By using mono-stable multivibrators, low pulse generator 201 and high pulse generator 202 can produce accurate, repeatable, and consistent discharge pulses, regardless of the profile quality of signal T_WAVE. It should be noted that low pulse generator 201 and high pulse generator 202 could be made to generate pulses during every clocking cycle, rather than only when an out-of-range signal is detected. Some circuit simplification could be achieved through this method, although at the price of increased power consumption. It should also be noted that the described implementation produces pulses that begin at the inflection points of signal T_WAVE, rather than being centered about the inflection points. While this has no significant impact on amplifier performance, a delay circuit can be included between oscillator 102 and triangle wave generator 103 in FIG. 2. By adding a delay of half the pulse duration to signal CK before it reaches triangle wave generator 103, the discharge pulses in signals PULSE_LO and PULSE_HI can be centered about their related inflection points in signal T_WAVE.

Returning to FIG. 2, it can be seen that a combination of AND gates 109 and 110, and an OR gate 111 provide the combinational logic for signals P_OUT, PULSE_LO and PULSE_HI. When signal AMP_OUT is not overmodulated, signal PULSE_HI remains in a constant HIGH state, so that the output of AND gate 109 is simply signal P_OUT. Meanwhile, signal PULSE_LO remains in a constant LOW state, so the output of AND gate 110 remains in a constant LOW state. Therefore, OR gate 111 passes signal P_OUT directly as signal D_OUT. However, when signal AMP_OUT is overmodulated and signal P_OUT is stuck in a HIGH state, low pulse generator 201 provides a periodic low pulse that is added to signal P_OUT by AND gate 109. Since signal P_OUT is inverted at AND gate 110, the output of AND gate 110 is kept low while P_OUT is high. Thus, OR gate 111 follows the output of AND gate 109, providing an acceptable signal D_OUT having a generally HIGH output with brief low-going pulses every clocking cycle. On the other hand, when signal AMP_OUT is overmodulated and signal P_OUT is stuck in a LOW state, high pulse generator 202 provides a periodic high pulse that is added to signal P_OUT by AND gate 110. In this case, the output of AND gate 109 is kept low as long as signal P_OUT is in a LOW state. Therefore, OR gate 111 follows the output of AND gate 110, providing an acceptable signal D_OUT having a generally LOW output with brief high-going pulses every clocking cycle.

Figure 6E:
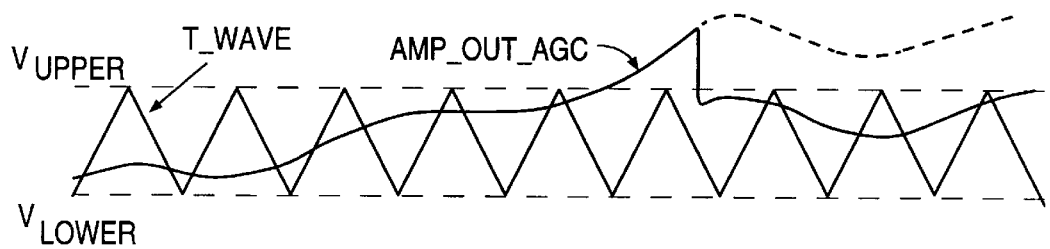
FIG. 6e shows an analog input signal AMP_OUT_AGC modified by an automatic gain control circuit, superimposed on a triangle wave T_WAVE.
Figure 6F:
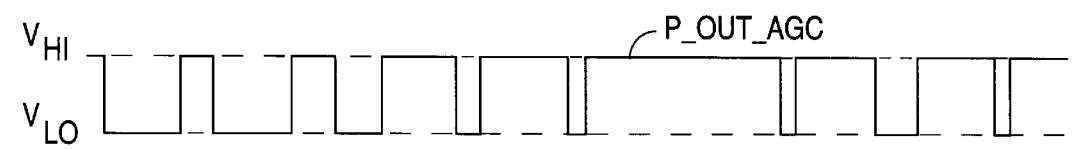
FIG. 6f is a rectangular wave P_OUT_AGC generated by the comparison of signal AMP_OUT_AGC and triangle wave T_WAVE.
Figure 6G:
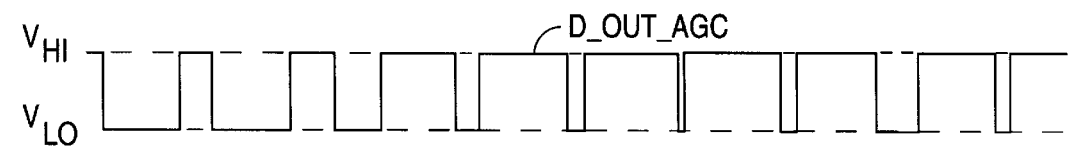
FIG. 6g is a rectangular wave D_OUT_AGC generated by subtracting discharge pulse waveform PULSE_LO from rectangular wave P_OUT_AGC.

In addition to output-limiting circuitry, the present invention also includes automatic gain control, or AGC, to enable transmission of the information of input signal A_SIG, even when signal AMP_OUT is overmodulated. As shown in FIG. 2, when an OR gate 203 detects a low-going pulse in signal PULSE_LO or a high-going signal in signal PULSE_HI, it sends a signal to an automatic gain control circuit 204. Circuit 204 then lowers the gain of amplifier circuit 112, in an attempt to bring signal AMP_OUT within the range defined by voltages Vlimit_hi and Vlimit_lo. Circuit 204 continues to reduce the gain of circuit 112 until pulses are no longer being generated in signals PULSE_LO or PULSE_HI. The effects of this automatic gain control are shown in FIG. 6e, where the gain of the out-of-range portion of signal AMP_OUT_AGC is lowered after an out-of-range pulse is generated. As can be seen in FIG. 6f, by reducing the gain of signal AMP_OUT_AGC in FIG. 6e, signal P_OUT_AGC now contains useful information even where the unmodified signal AMP_OUT in FIG. 6b would otherwise have been out-of-range. Contrastingly, signal P_OUT in FIG. 6c is pegged at a constant voltage Vhi once signal AMP_OUT in FIG. 6b goes out-of-range. Signal P_OUT_AGC in FIG. 6f is combined with signal PULSE_LO or PULSE_HI as appropriate, producing an output signal D_OUT_AGC as shown in FIG. 6g. Signal D_OUT_AGC enables reproduction of a representation of the original input signal A_SIG at speaker 114, rather than simply generating an uninformative, potentially damaging constant maximum output.

I claim:

1. In a Class D audio amplifier having:
    a pulse width modulation circuit comprising a triangle wave generator to produce a triangle wave varying between upper inflection points at an upper voltage potential and lower inflection points at a lower voltage potential; and
    a comparator circuit to compare an input analog signal with said triangle wave and produce a primary output signal that switches between a high voltage potential and a low voltage potential each time said input analog signal and said triangle wave intersect;
    a pulse generation circuit to add low pulses and high pulses coinciding with said upper inflection points and said lower inflection points, respectively, to said primary output signal, wherein said low and high pulses are generated without reference to the profile of said constant triangular wave.

2. The circuit of claim 1 wherein:
    the duration of each of said low and high pulses is substantially less than the period of said constant triangle wave;
    the magnitude of said low pulses is substantially equal to said low voltage potential; and
    the magnitude of said high pulses is substantially equal to said high voltage potential.

3. The circuit of claim 2 wherein said pulse generation circuit comprises a first mono-stable multivibrator for generating said low pulses and a second mono-stable multivibrator for generating said high pulses.

4. The circuit of claim 3 wherein the triggering of said first and second mono-stable multivibrators is performed a predetermined increment of time before said constant triangle wave reaches one of said upper or lower inflection points, respectively.

5. The circuit of claim 3 wherein said first and second mono-stable multivibrators are both triggered at each of said upper and lower inflection points.

6. The circuit of claim 3 wherein said first mono-stable multivibrator is triggered at each of said upper inflection points, and said second mono-stable multivibrator is triggered at each of said lower inflection points.

7. The circuit of claim 3 wherein:
    said first mono-stable multivibrator is triggered only when said primary output signal is at said high voltage potential a predetermined increment of time before any of said upper inflection points; and
    said second mono-stable multivibrator is triggered only when said primary output signal is at said low voltage potential said predetermined increment of time before any of said lower inflection points.

8. The circuit of claim 1 further comprising:
    an input amplifier circuit to apply a known gain to said input analog signal and generate an amplified analog signal; and
    an automatic gain control circuit to reduce the gain of said input amplifier circuit by a predetermined amount whenever one of said low pulses is generated while said primary output signal is at a high voltage potential or one of said high pulses is generated while said primary output signal is at a low voltage potential.

9. In a Class D amplifier including a pulse-width modulator (PWM), a method for limiting the output of the amplifier comprising the steps of:
    converting an input analog signal into a pulse-width modulated primary output signal oscillating between two limit voltage potentials;
    generating a discharge pulse when said input analog signal is overmodulated to the limit voltage potential at which said primary output signal is not sitting;
    combining said discharge pulse with said primary output signal; and reducing the gain of said input analog signal whenever said discharge pulse is generated.

10. The method of claim 9, wherein said generating step does not use the profile of the triangle wave used by said PWM.

11. The method of claim 9, wherein said generating step uses a mono-stable multivibrator to generate said discharge pulse.

12. The method of claim 11, wherein said mono-stable-multivibrator is triggered by the clock of said PWM.

13. The method of claim 12, wherein said mono-stable-multivibrator is triggered by the clock of said PWM only when said input analog signal is overmodulated.

* * * * *

UNITED STATES PATENT AND TRADEMARK OFFICE
CERTIFICATE OF CORRECTION

PATENT NO. : 5,917,369  
DATED : June 29, 1999  
INVENTOR(S) : Huey Nguyen

Page 1 of 1

It is certified that error appears in the above-identified patent and that said Letters Patent is hereby corrected as shown below:

Column 1,
Line 50, delete "P OUT" and insert -- P_OUT --.
Line 57, delete "105" and insert -- 115 --.
Line 66, after "PULSE_LO" insert -- (Fig. 5f) --.
Line 67, after "PULSE_HI" insert -- (Fig. 5g) --.

Column 3,
Lines 15 and 16, delete "FIG. 5e-5g shows the generation of discharge pulses PULSE_LO and PULSE_HI and insert -- FIG. 5e shows the generation of discharge pulses PULSE_LO and PULSE_HI;
FIG. 5f shows the low-going pulsar signal "PULSE_LO" of comparator 107;
FIG. 5g shows the high-going pulse signal "PULSE_HI" of comparator 108. --

Signed and Sealed this

Fifth Day of March, 2002

*Attest:*

*Attesting Officer*

JAMES E. ROGAN  
*Director of the United States Patent and Trademark Office*